United States Patent
Iijima et al.

(10) Patent No.: US 10,868,029 B2
(45) Date of Patent: Dec. 15, 2020

(54) STAGGERED SEMICONDUCTOR MEMORY DEVICE

(71) Applicant: TOSHIBA MEMORY CORPORATION, Minato-ku (JP)

(72) Inventors: Jun Iijima, Yokkaichi (JP); Masayoshi Tagami, Kuwana (JP); Takamasa Usui, Yokkaichi (JP); Takahito Nishimura, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 18 days.

(21) Appl. No.: 16/127,962

(22) Filed: Sep. 11, 2018

(65) Prior Publication Data

US 2019/0296035 A1    Sep. 26, 2019

(30) Foreign Application Priority Data

Mar. 22, 2018   (JP) ................................. 2018-053939

(51) Int. Cl.
*H01L 27/11578*   (2017.01)
*H01L 27/11568*   (2017.01)
*G11C 11/24*   (2006.01)

(52) U.S. Cl.
CPC ........ *H01L 27/11578* (2013.01); *G11C 11/24* (2013.01); *H01L 27/11568* (2013.01)

(58) Field of Classification Search
CPC ......... H01L 27/11582; H01L 27/11556; H01L 27/11565; H01L 27/11578; H01L 27/11551; H01L 27/0688; H01L 21/8221; H01L 27/11568; H01L 27/1157
See application file for complete search history.

(56) References Cited

U.S. PATENT DOCUMENTS

| | | |
|---|---|---|
| 2015/0017771 A1 | 1/2015 | Lee et al. |
| 2015/0078077 A1 | 3/2015 | Kanda |
| 2015/0206896 A1 | 7/2015 | Chen |
| 2015/0221667 A1 | 8/2015 | Fukuzumi et al. |
| 2015/0340371 A1* | 11/2015 | Lue .................. H01L 27/11582 257/324 |
| 2016/0079253 A1 | 3/2016 | Mori et al. |

(Continued)

FOREIGN PATENT DOCUMENTS

| | | |
|---|---|---|
| JP | 2015-60602 | 3/2015 |
| JP | 2015-149413 | 8/2015 |
| TW | 201721921 A | 6/2017 |

*Primary Examiner* — Allen L Parker
*Assistant Examiner* — Gustavo G Ramallo
(74) *Attorney, Agent, or Firm* — Oblon, McClelland, Maier & Neustadt, L.L.P.

(57) ABSTRACT

According to an embodiment, a semiconductor memory device includes a substrate, a stacked body, a plurality of columnar portions, a plurality of interconnects, and a plurality of connection portions. The plurality of interconnects extends in a first direction parallel to an upper surface of the substrate. When viewed from a second direction perpendicular to the stacking direction and the first direction, a portion of a first connection portion overlaps a portion of a second connection portion. The first connection portion is connected to a first interconnect of the plurality of interconnects. The second connection portion is connected to a second interconnect of the plurality of interconnects adjacent to the first interconnect in the second direction.

7 Claims, 7 Drawing Sheets

(56) References Cited

U.S. PATENT DOCUMENTS

| | | |
|---|---|---|
| 2016/0141301 A1 | 5/2016 | Mokhlesi et al. |
| 2016/0268282 A1* | 9/2016 | Ishibashi ............ H01L 27/11582 |
| 2017/0077025 A1* | 3/2017 | Akutsu ............. H01L 27/11565 |
| 2017/0125433 A1* | 5/2017 | Ogawa ................ H01L 23/5226 |
| 2017/0200735 A1* | 7/2017 | Konagai ........... H01L 27/11582 |
| 2017/0256560 A1* | 9/2017 | Tsuda ................ H01L 27/11582 |
| 2018/0061841 A1 | 3/2018 | Tao et al. |
| 2019/0067318 A1* | 2/2019 | Shioda .............. H01L 27/11582 |
| 2019/0148506 A1* | 5/2019 | Kanakamedala ............................ H01L 27/11556 257/315 |
| 2019/0220429 A1* | 7/2019 | Ranjan .................. G06F 13/128 |
| 2019/0221573 A1* | 7/2019 | Koshiishi ............ H01L 23/5226 |

\* cited by examiner

STAGGERED SEMICONDUCTOR MEMORY DEVICE

CROSS-REFERENCE TO RELATED APPLICATIONS

This application is based upon and claims the benefit of priority from Japanese Patent Application No. 2018-053939, filed on Mar. 22, 2018; the entire contents of which are incorporated herein by reference.

FIELD

Embodiments of the invention relate generally to a semiconductor memory device.

BACKGROUND

A semiconductor memory device has been proposed in which memory cells are arranged three-dimensionally. In such a semiconductor memory device, a stacked body that includes multiple electrode layers is formed above a substrate; and a channel and a charge storage film are formed inside each of multiple memory holes piercing the stacked body. Contacts are provided above the memory holes; and the channels and bit lines are connected via the contacts. As the memory cells are downscaled, the spacing between the memory holes decreases; and it is difficult to form the contacts.

BRIEF DESCRIPTION OF THE DRAWINGS

FIG. 5A and FIG. 5B to FIG. 7A and FIG. 7B are cross-sectional views showing a method for manufacturing the semiconductor memory device according to the first embodiment.

DETAILED DESCRIPTION

Figure 1:
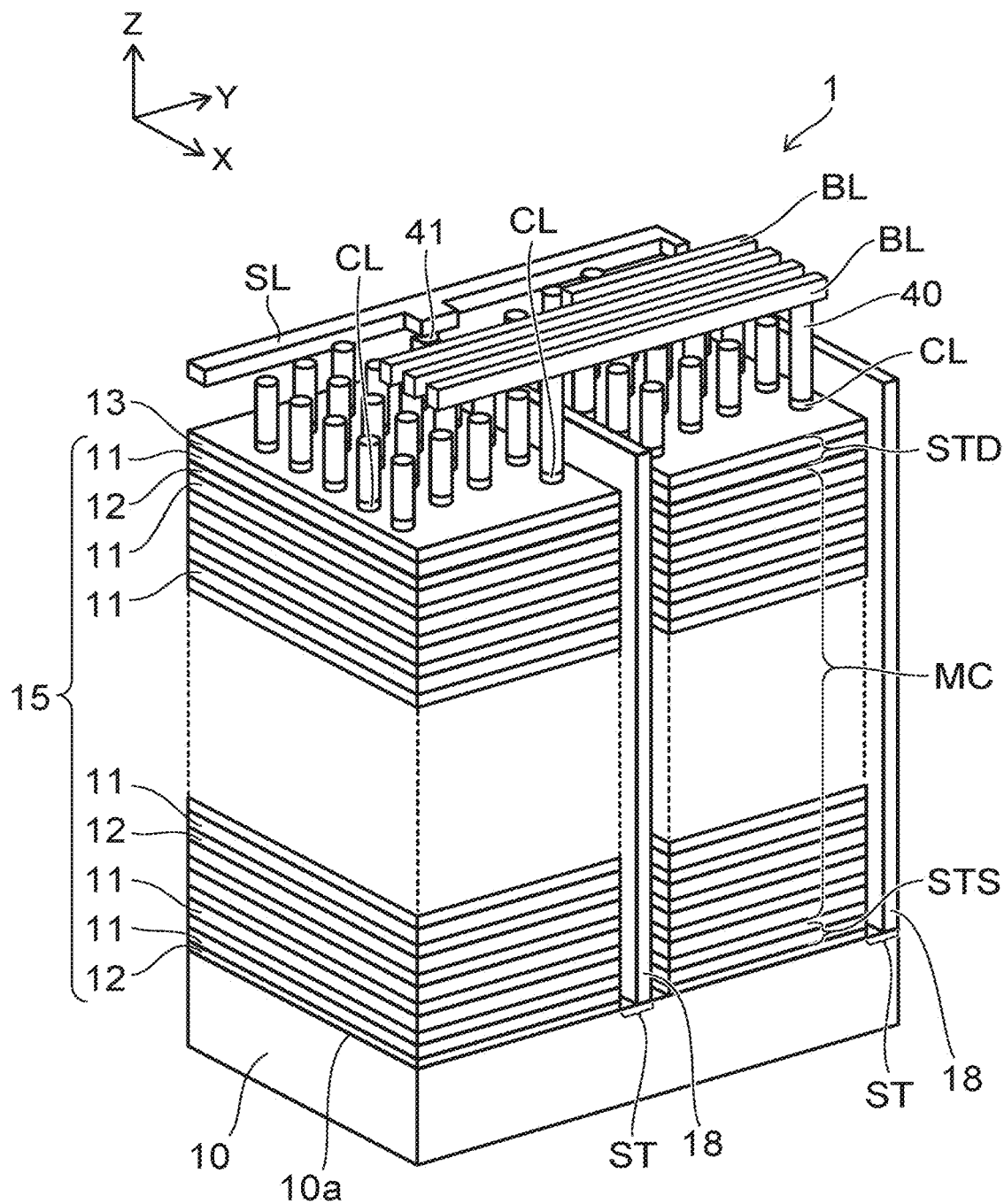
FIG. 1 is a perspective view showing a semiconductor memory device according to a first embodiment.

According to an embodiment, a semiconductor memory device includes a substrate, a stacked body, a plurality of columnar portions, a plurality of interconnects, and a plurality of connection portions. The stacked body is provided above the substrate. The stacked body includes a plurality of electrode layers stacked to be separated from each other. The plurality of columnar portions extends through the stacked body in a stacking direction of the plurality of electrode layers of the stacked body. Each of the plurality of columnar portions includes a semiconductor portion. The plurality of interconnects extends in a first direction and is electrically connected to the semiconductor portions of the plurality of columnar portions. The first direction is parallel to an upper surface of the substrate. The plurality of connection portions is provided between the plurality of columnar portions and the plurality of interconnects. The plurality of connection portions includes a connection portion connected correspondingly to one columnar portion of the plurality of columnar portions and one interconnect of the plurality of interconnects. When viewed from a second direction perpendicular to the stacking direction and the first direction, a portion of a first connection portion overlaps a portion of a second connection portion. The first connection portion is connected to a first interconnect of the plurality of interconnects. The second connection portion is connected to a second interconnect of the plurality of interconnects adjacent to the first interconnect in the second direction.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

First Embodiment

FIG. 1 is a perspective view showing a semiconductor memory device 1.

As shown in FIG. 1, a substrate 10 is provided in the semiconductor memory device 1. The substrate 10 is a semiconductor substrate and includes silicon (Si) such as single-crystal silicon, etc.

In the specification, two mutually-orthogonal directions parallel to an upper surface 10a of the substrate 10 are taken as an X-direction and a Y-direction. A direction orthogonal to both the X-direction and the Y-direction is taken as a Z-direction.

A stacked body 15, columnar portions CL, and interconnect portions 18 are further provided in the semiconductor memory device 1.

The stacked body 15 is provided above the substrate 10. The foundation of the stacked body 15 is not limited to the substrate 10; and a circuit portion in which circuit elements and interconnect layers are formed above the substrate 10 may be formed as the foundation.

The stacked body 15 includes multiple electrode layers and multiple insulating layers 12. For example, the electrode layers 11 include a metal such as tungsten (W), etc. A main portion that is made of, for example, tungsten and a barrier metal layer that is made from, for example, titanium nitride (TiN) and covers the surface of the main portion may be provided in the electrode layer 11. The insulating layers 12 include, for example, silicon oxide (SiO). The insulating layers are inter-layer insulating layers provided between the electrode layers 11. The number of stacks of the electrode layers 11 is arbitrary.

For example, among the multiple electrode layers 11, the electrode layer 11 of the lowermost layer corresponds to a source-side select gate; and the electrode layer 11 of the uppermost layer corresponds to a drain-side select gate. For example, among the multiple electrode layers 11, the electrode layers 11 other than the electrode layer 11 of the lowermost layer and the electrode layer 11 of the uppermost layer correspond to word lines. In the semiconductor memory device 1, a source-side select transistor STS and a drain-side select transistor STD that respectively have the source-side select gate and the drain-side select gate as gate electrodes are formed. Multiple memory cells MC that have the word lines as gate electrodes are connected in series between the source-side select transistor STS and the drain-side select transistor STD.

An insulating layer 13 that includes silicon oxide or the like is provided above the stacked body 15.

The columnar portions CL are provided inside the stacked body 15 and the insulating layer 13. The columnar portions CL are multiply provided and extend through the stacked body 15 and the insulating layer 13 in the Z-direction. For example, the columnar portions CL are formed in circular columnar configurations or elliptical columnar configurations.

Contacts 40 are provided above the columnar portions CL. The contacts 40 include, for example, a conductive material such as a metal, etc. For example, the contacts 40 are formed by stacking metal-including layers such as a tungsten layer, a titanium nitride layer, etc.

Multiple bit lines BL are provided above the contacts 40. The multiple bit lines BL are separated from each other in the X-direction and extend in the Y-direction. The multiple bit lines BL include, for example, a conductive material such as a metal, etc. The upper ends of the columnar portions CL are connected to the bit lines BL via the contacts 40.

The interconnect portions 18 are provided inside slits ST formed in the stacked body 15. The interconnect portions 18 are multiply provided and extend through the stacked body 15 in the X-direction and the Z-direction. The interconnect portions 18 include, for example, a conductive material such as a metal, etc. For example, the interconnect portions 18 are formed in plate configurations. Insulating films (not illustrated) that insulate the interconnect portions 18 from the electrode layers 11 of the stacked body 15 are provided at the side walls of the interconnect portions 18. The lower ends of the interconnect portions 18 are positioned above the substrate 10.

The multiple electrode layers 11 that are stacked in the Z-direction are subdivided into blocks in the Y-direction by the multiple interconnect portions 18 extending in the X-direction and the Z-direction. Each of the blocks correspond to a portion between the mutually-adjacent interconnect portions 18 in which word lines are formed as control gates. For example, four columns of the columnar portions CL are arranged in the Y-direction in each of the blocks. The bit line BL extends in the Y-direction over the multiple blocks and is connected to one columnar portion CL of each block.

Contacts 41 are provided above the interconnect portions 18. The contacts 41 include, for example, a conductive material such as a metal, etc. A source line SL is provided above the contacts 41. The upper ends of the interconnect portions 18 are connected to the source line SL via the contacts 41.

Figure 2:
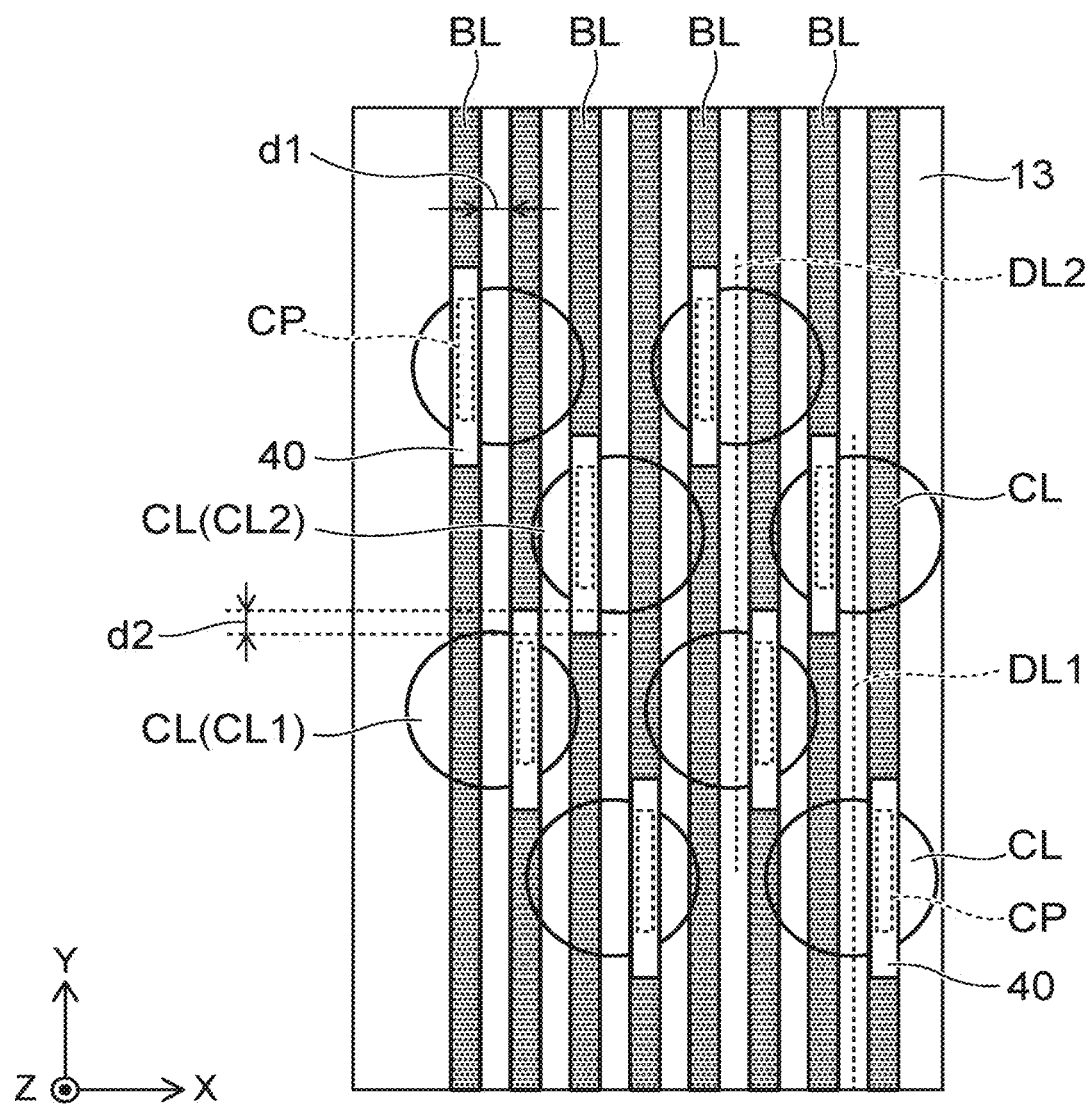
FIG. 2 is a plan view showing the semiconductor memory device according to the first embodiment.

FIG. 2 is a plan view showing the semiconductor memory device 1.

Figure 3A:
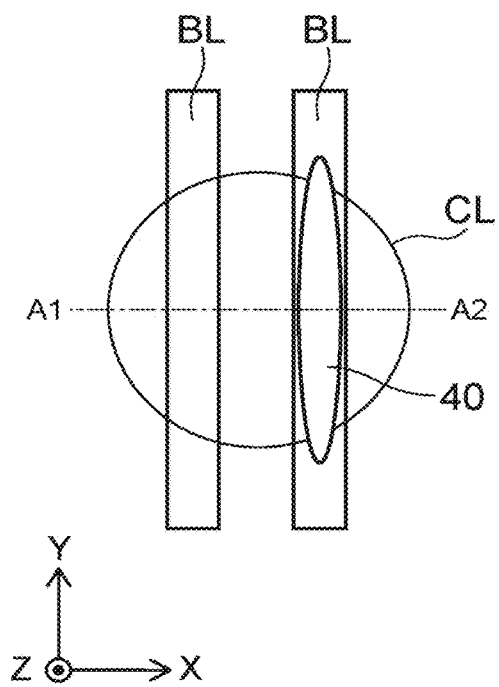
FIG. 3A is an enlarged plan view showing a portion of the semiconductor memory device according to the first embodiment.
Figure 3B:
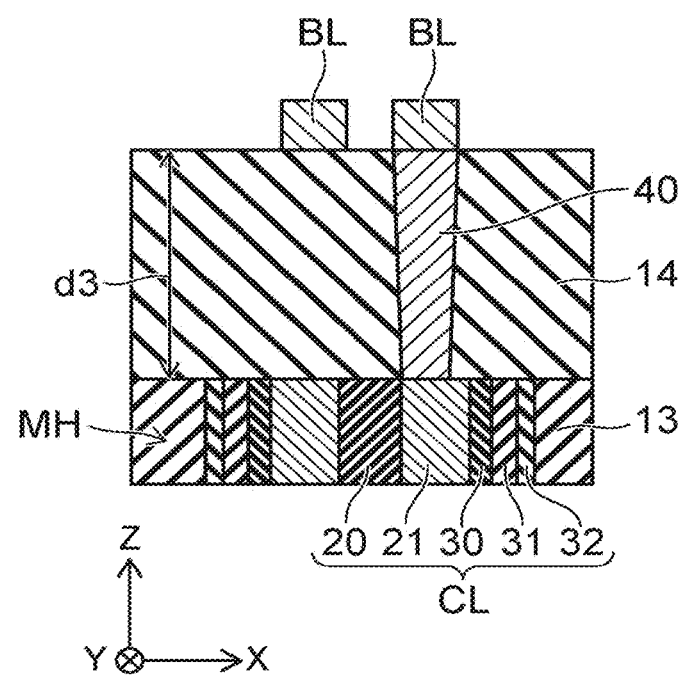
FIG. 3B is a cross-sectional view of line A1-A2 of FIG. 3A.

FIG. 3A is an enlarged plan view showing a portion of the semiconductor memory device 1; and FIG. 3B is a cross-sectional view of line A1-A2 of FIG. 3A.

Figure 4A:
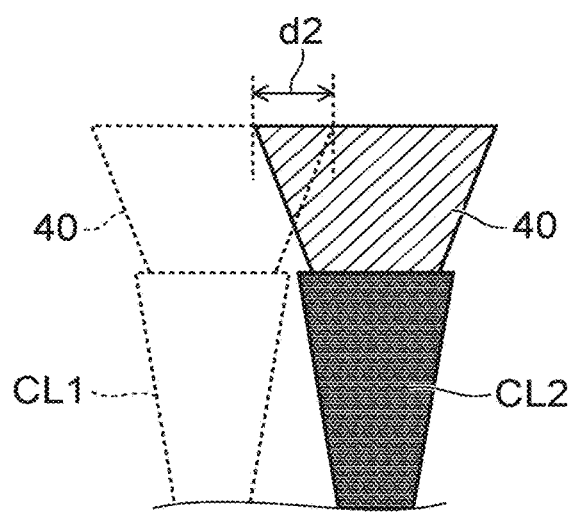
FIG. 4A is a cross-sectional view showing a portion of the semiconductor memory device according to the first embodiment.
Figure 4B:
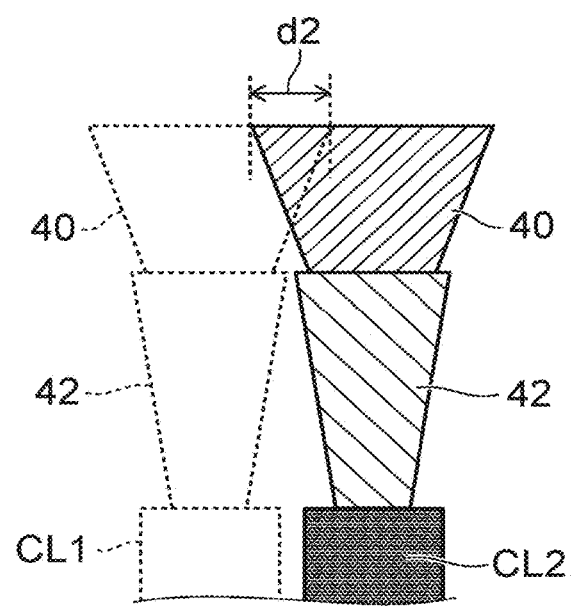
FIG. 4B is a cross-sectional view showing a portion of a semiconductor memory device according to a variation of the first embodiment.

FIG. 4A and FIG. 4B are cross-sectional views showing portions of the semiconductor memory device 1.

FIG. 2 shows the multiple columnar portions CL disposed between the interconnect portions 18 (inside the block). In FIG. 2, the bit lines BL are shown as a light color; and the contacts 40 are shown transparently. FIG. 3A is an enlarged view of a portion of FIG. 2 and shows a connection of the columnar portion CL and the bit line BL via the contact 40. FIG. 3B is a cross-sectional view of FIG. 3A and shows the connection of the columnar portion CL and the bit line BL via the contact 40.

FIG. 4A and FIG. 4B show the positional relationship between the contacts 40 of columnar portions CL1 and CL2.

As shown in FIG. 2, the multiple columnar portions CL are arranged in a staggered configuration when viewed from the Z-direction. In the example of FIG. 2, the multiple columnar portions CL are formed in four columns in which the columnar portions CL are arranged along the X-direction. The columns (the four columns) of the columnar portions CL are arranged along the Y-direction. Here, it is taken that the columns are arranged in order in the Y-direction; among the multiple columnar portions CL, a columnar portion CL1 corresponds to a columnar portion CL positioned in the second column; and a columnar portion CL2 corresponds to a columnar portion CL positioned in the third column.

For example, as shown by an imaginary straight line DL1 linking two columnar portions CL, the columnar portions CL that are positioned in the first column and the columnar portions CL that are positioned in the third column are arranged along the Y-direction. As shown by an imaginary straight line DL2 linking two columnar portions CL, the columnar portions CL that are positioned in the second column and the columnar portions CL that are positioned in the fourth column are arranged along the Y-direction.

The contact 40 is positioned above the columnar portion CL. When viewed from the Z-direction, the portion where the contact 40 and the columnar portion CL overlap corresponds to a contact portion CP. That is, the contact portion CP is the upper end portion of the columnar portion CL and the lower end portion of the contact 40.

The bit line BL is connected to the columnar portion CL via the contact 40. Each of the contacts 40 correspondingly connects one columnar portion CL and one bit line BL. In the arrangement of the columnar portions CL of FIG. 2, two bit lines BL extend in the Y-direction above each of the columnar portions CL. For example, a distance d1 between the bit lines BL adjacent to each other in the X-direction is about 20 nanometers.

As shown in FIG. 3A, when viewed from the Z-direction, the configuration of the contact 40 is, for example, an ellipse having the Y-direction (the bit line BL-direction) as a major axis and the X-direction as a minor axis. The configuration of the contact 40 is not limited to an ellipse and may be a configuration such as a circle, a rectangle, etc.

As shown in FIG. 3B, the columnar portion CL that is positioned inside a memory hole MH includes a core insulating film 20, a channel 21, a tunneling insulating film 30, a charge storage film 31, and a blocking insulating film 32. Only the upper portion of the columnar portion CL is illustrated in FIG. 3B.

The core insulating film 20 includes, for example, silicon oxide. The core insulating film 20 extends in the Z-direction in a columnar configuration. The core insulating film 20 may not be included in the columnar portion CL.

The channel 21 is provided at the periphery of the core insulating film 20. The channel 21 is a semiconductor portion and includes, for example, silicon. The channel 21 includes, for example, polysilicon made of amorphous silicon that is crystallized. The channel 21 extends in the Z-direction in a tubular configuration and is electrically connected to the bit line BL via the contact 40.

The tunneling insulating film 30 is provided at the periphery of the channel 21. The tunneling insulating film 30 includes, for example, silicon oxide. Although the tunneling insulating film 30 includes a single-layer film such as a silicon oxide film or the like in the example shown in FIG. 3B, the tunneling insulating film 30 may include multiple films. In the case where the tunneling insulating film 30 includes multiple films, a stacked film of a silicon oxide film and a silicon oxynitride film may be used.

The tunneling insulating film 30 is a potential barrier between the charge storage film 31 and the channel 21. When programming, information is programmed by electrons tunneling through the tunneling insulating film 30 from the channel 21 into the charge storage film 31. On the other hand, when erasing, the information that is stored is erased by holes tunneling through the tunneling insulating film 30 from the channel 21 into the charge storage film 31 and canceling the charge of the electrons.

The charge storage film 31 is provided at the periphery of the tunneling insulating film 30. The charge storage film 31 includes, for example, silicon nitride (SiN).

The memory cell MC that includes the charge storage film 31 is formed at each crossing portion between the channel 21 and the electrode layers 11. The charge storage film 31 has trap sites that trap charge inside a film. The threshold voltage of the memory cell MC changes according to the existence or absence of the charge trapped in the trap sites and the amount of the trapped charge. Thereby, the memory cell MC stores information.

In the semiconductor memory device 1, many memory cells MC that each include the charge storage film 31 are arranged in a three-dimensional lattice configuration along the X-direction, the Y-direction, and the Z-direction; and data can be stored in each of the memory cells MC.

The blocking insulating film 32 is provided at the periphery of the charge storage film 31. The blocking insulating film 32 includes, for example, silicon oxide. Although the blocking insulating film 32 includes a single-layer film such as a silicon oxide film or the like in the example shown in FIG. 3B, the blocking insulating film 32 may include multiple films. In the case where the blocking insulating film 32 includes multiple films, a stacked film of a silicon oxide film and an aluminum oxide film may be used. When forming the electrode layers 11, for example, the blocking insulating film 32 protects the charge storage film 31 from the etching. The blocking insulating film 32 suppresses discharge of the charge stored in the charge storage film 31 into the electrode layer 11 and/or back-tunneling of electrons from the electrode layer 11 into the columnar portion CL.

An insulating layer 14 is provided above the columnar portions CL and the insulating layer 13. The insulating layer 14 includes, for example, silicon oxide. The contacts 40 are positioned inside the insulating layer 14. In the X-Z cross section, the configuration of the contact 40 is, for example, a rectangular configuration. A distance d3 in the Z-direction between the columnar portion CL and the bit line BL is, for example, not less than 100 nanometers and not more than 500 nanometers. The distance d3 corresponds to the thickness in the Z-direction of the contact 40.

As shown in FIG. 4A, the configuration of the contact 40 is, for example, a rectangular configuration in the Y-Z cross section. In the Y-Z cross section, the configuration of the contact 40 is, for example, a tapered configuration with respect to the direction toward the columnar portion CL (the −Z direction).

When viewed from the X-direction, a portion of the contact 40 of the columnar portion CL1 overlaps a portion of the contact 40 of the columnar portion CL2. The bit line BL to which the contact 40 above the columnar portion CL1 is connected and the bit line BL to which the contact 40 above the columnar portion CL2 is connected are adjacent to each other in the X-direction (referring to FIG. 2).

The columnar portions CL1 and CL2 correspond to columnar portions CL positioned respectively in the second column and the third column. Although the columnar portions CL1 and CL2 do not include overlapping portions when viewed from the X-direction, the columnar portions CL1 and CL2 have the positional relationship of mutually-adjacent columnar portions CL having the shortest distance between the columnar portions CL among the multiple columnar portions CL.

As shown in FIG. 2 and FIG. 4A, the contact 40 that is above the columnar portion CL1 and the contact 40 that is above the columnar portion CL2 overlap by the amount of a distance d2 at the upper ends when viewed from the X-direction. The distance d2 is a distance in the Y-direction and corresponds to the thickness in the Y-direction of the portion where the contacts 40 overlap at the upper ends.

The contact 40 may not be positioned directly above the columnar portion CL; and a contact 42 may be provided between the columnar portion CL and the contact 40 as shown in FIG. 4B. In such a case, the contacts 40 above the mutually-adjacent columnar portions CL1 and CL2 overlap by the amount of the distance d2 at the upper ends when viewed from the X-direction.

A method for manufacturing the semiconductor memory device according to the embodiment will now be described.

FIG. 5A and FIG. 5B to FIG. 7A and FIG. 7B are cross-sectional views showing the method for manufacturing the semiconductor memory device 1.

Figure 8:
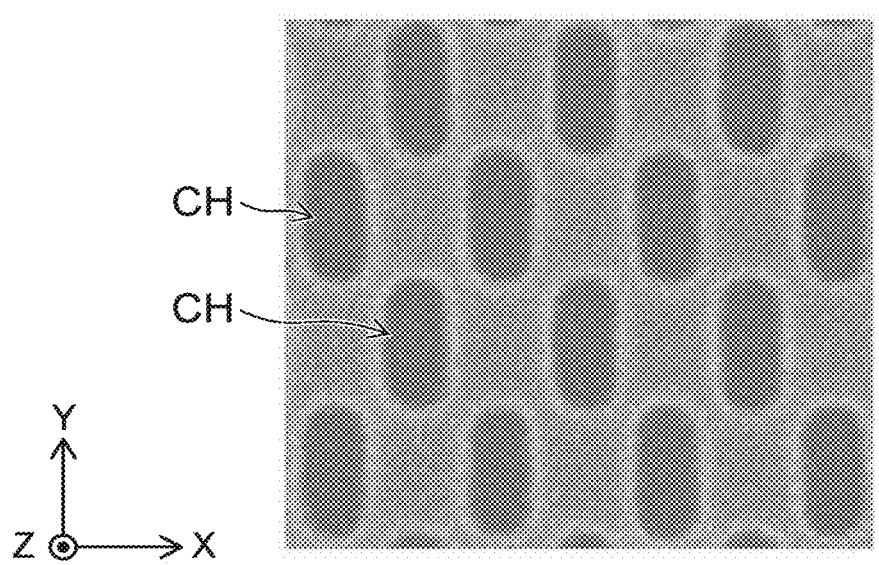
FIG. 8 is a figure showing an arrangement of contact holes.

FIG. 8 is a figure showing the arrangement of the contact holes

The formation processes of the contacts 40 will now be described using FIG. 6A, FIG. 6B, FIG. 7A, and FIG. 7B after describing the formation processes of the stacked body 15, the columnar portions CL, and the interconnect portions 18 using FIG. 5A and FIG. 5B.

First, the formation processes of the stacked body 15, the columnar portions CL, and the interconnect portions 18 will be described using FIG. 5A and FIG. 5B.

Figure 5A:
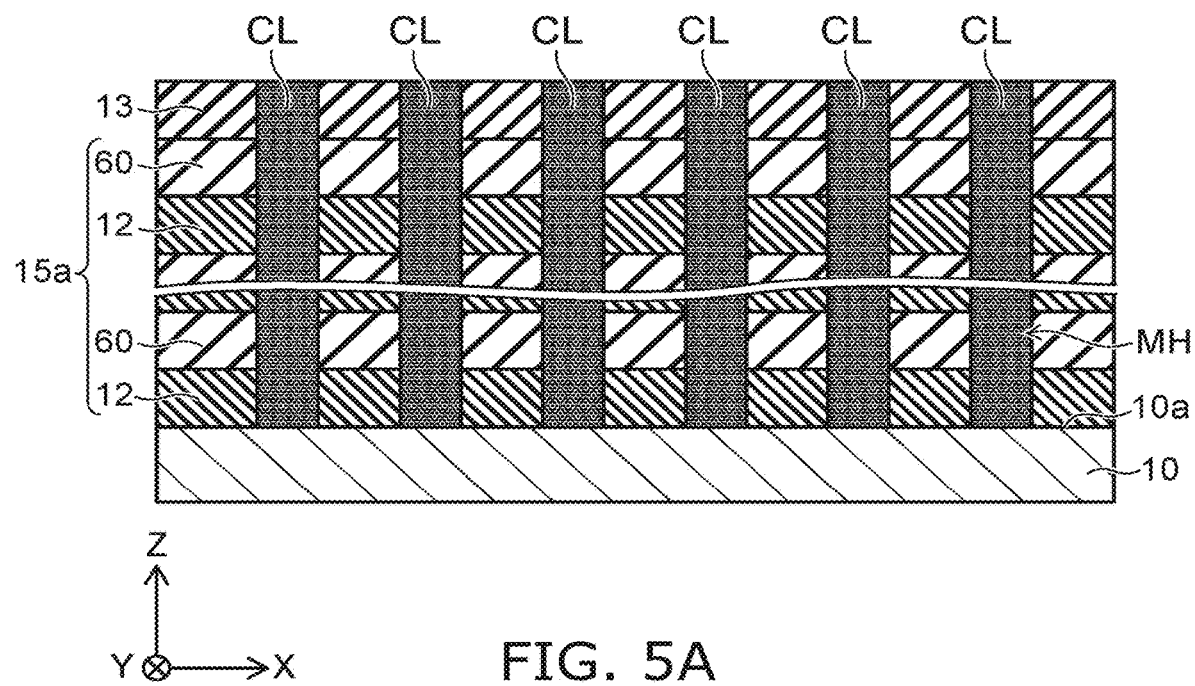

As shown in FIG. 5A, for example, a stacked body 15a is formed above the substrate 10 by alternately stacking the insulating layers 12 and sacrificial layers 60 along the Z-direction by CVD (Chemical Vapor Deposition). For example, the insulating layers 12 are formed of silicon oxide; and the sacrificial layers 60 are formed of silicon nitride. Subsequently, the insulating layer 13 is formed above the stacked body 15a.

Continuing, the multiple memory holes MH are formed in the stacked body 15a and the insulating layer 13 by etching such as RIE (Reactive Ion Etching), etc. The multiple memory holes MH are formed in a staggered configuration when viewed from the Z-direction.

Continuing, for example, the blocking insulating film 32 is formed on the inner surfaces of the memory holes MH by depositing silicon oxide by CVD; and the charge storage film 31 is formed on the blocking insulating film 32 by depositing silicon nitride. Subsequently, the tunneling insulating film 30 is formed on the charge storage film 31 by depositing silicon oxide. Subsequently, the tunneling insulating film 30, the charge storage film 31, and the blocking insulating film 32 are removed from the bottom surfaces of the memory holes MH by etching such as RIE, etc.; and the upper surface 10a of the substrate 10 is exposed.

Continuing, the channel 21 is formed by depositing silicon; and the core insulating film 20 is formed by depositing silicon oxide. Thereby, the columnar portions CL that each include the core insulating film 20, the channel 21, the tunneling insulating film 30, the charge storage film 31, and the blocking insulating film 32 are formed inside the memory holes MH. Subsequently, the multiple slits ST that extend in the X-direction and the Z-direction are formed in the stacked body 15 and the insulating layer 13 (referring to FIG. 1).

Figure 5B:
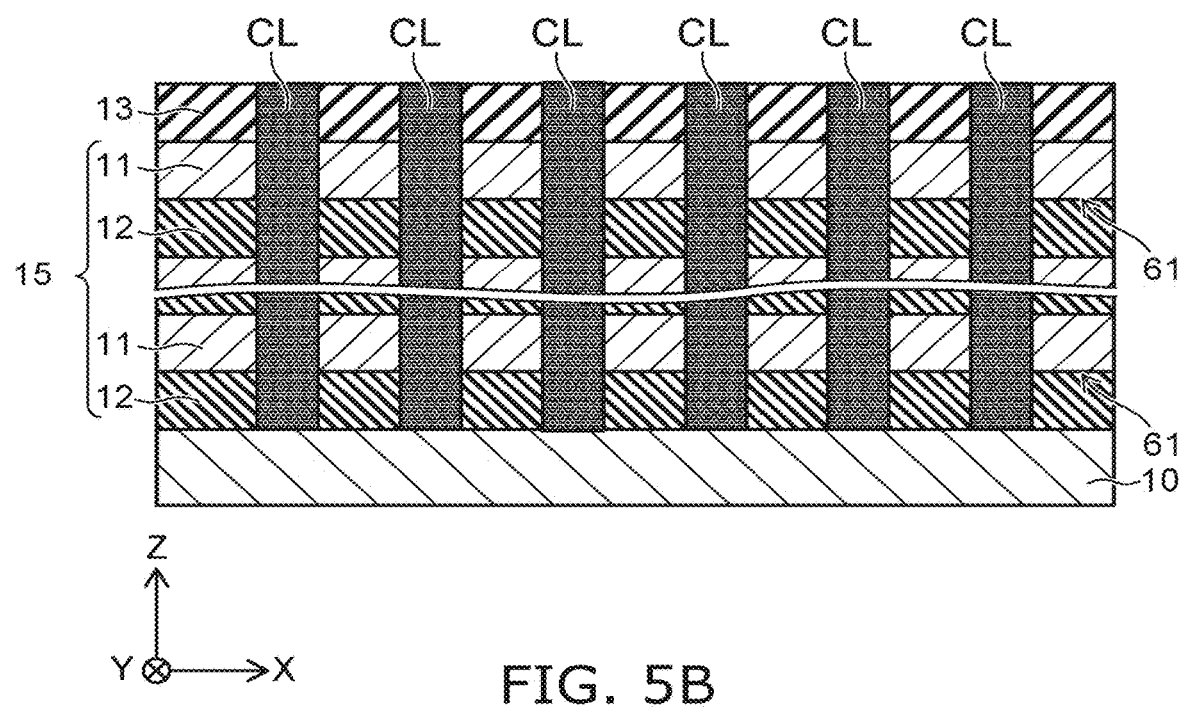

Then, as shown in FIG. 5B, the sacrificial layers 60 of the stacked body 15a are removed by etching via the slits ST. For example, phosphoric acid is used as the etchant of wet etching in the case where the sacrificial layers 60 are formed of silicon nitride. A gap 61 is formed by removing the sacrificial layers 60 via the slits ST; and the interior of the gap 61 is filled by depositing a metal such as tungsten, etc., via the slits ST. Thereby, the sacrificial layers 60 of the stacked body 15a are replaced with the electrode layers 11; and the stacked body 15 that includes the electrode layers 11 and the insulating layers 12 is formed. Subsequently, after forming an insulating film on the inner wall surfaces of the slits ST, the interconnect portions 18 are formed inside the slits ST (referring to FIG. 1).

Continuing, the formation processes of the contacts 40 will now be described using FIG. 6A, FIG. 6B, FIG. 7A, and FIG. 7B. FIG. 6A, FIG. 6B, FIG. 7A, and FIG. 7B show the insulating layer 13 and higher components.

In the embodiment, the contacts 40 are formed by a device using NIL (Nano Imprint Lithography). NIL is a patterning method in which a mold (a template) in which a pattern is carved is pressed onto a coated resist, and UV (ultraviolet) curing is performed.

For example, a UV light source, the template, and the object to be patterned are provided in the device using NIL. The template includes, for example, quartz. The template is formed by carving out the desired pattern of unevennesses, etc., in the front surface, polishing the back surface, and subsequently correcting the pattern of the front surface. Thereby, a master template is formed. Subsequently, replicate templates (replica templates) may be formed based on the master template. For example, the object to be patterned is provided on a wafer stage.

Figure 6A:
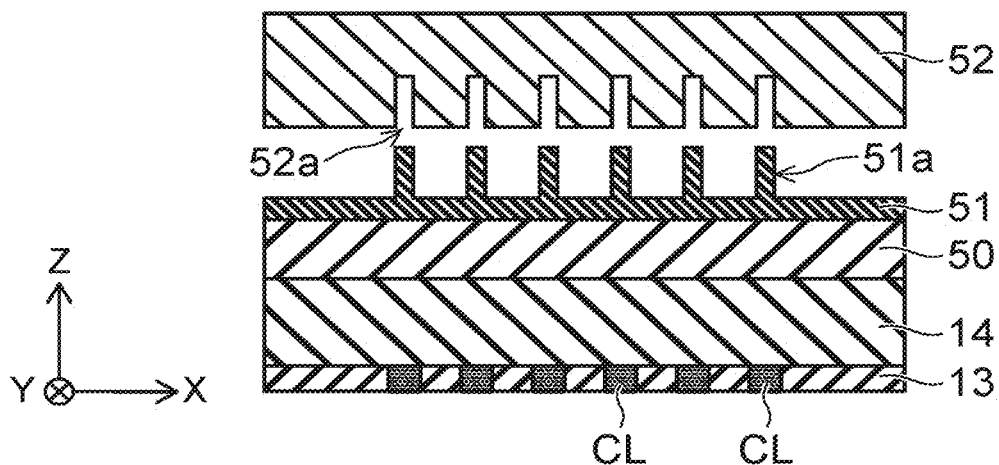

After the interconnect portions 18 are formed inside the slits ST, the insulating layer 14 is formed above the insulating layer 13 as shown in FIG. 6A by, for example, CVD. For example, the insulating layer 14 is formed of silicon oxide. Continuing, a film 50 is formed above the insulating layer 14. The film 50 includes, for example, carbon (C) and is coated onto the insulating layer 14.

Continuing, a resist film 51 is formed above the film 50. For example, the resist film 51 is formed above the film 50 by inkjet coating. Subsequently, a template 52 is pressed onto the resist film 51. Multiple unevennesses 51a are formed in the upper surface of the resist film 51 by pressing the template 52 including multiple unevennesses 52a onto the resist film 51. The protrusions of the unevennesses 51a are formed to have ellipse configurations having the Y-direction as major axes and the X-direction as minor axes when viewed from the Z-direction at positions above the columnar portions CL.

Figure 6B:
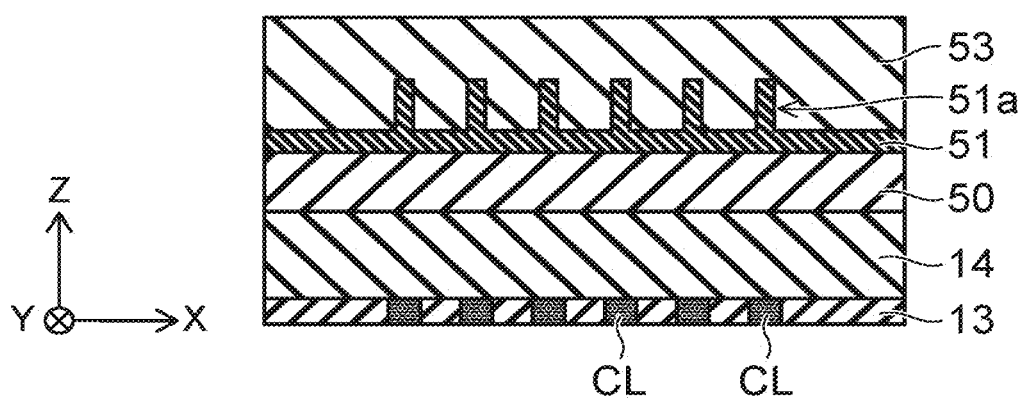

Continuing as shown in FIG. 6B, a film 53 is formed above the resist film 51 including the multiple unevennesses 51a. The film 53 includes, for example, a reversing member and is coated onto the resist film 51 to cover the multiple unevennesses 51a. Subsequently, etch-back of the film 53 is performed to expose the upper surfaces of the protrusions of the unevennesses 51a.

Figure 7A:
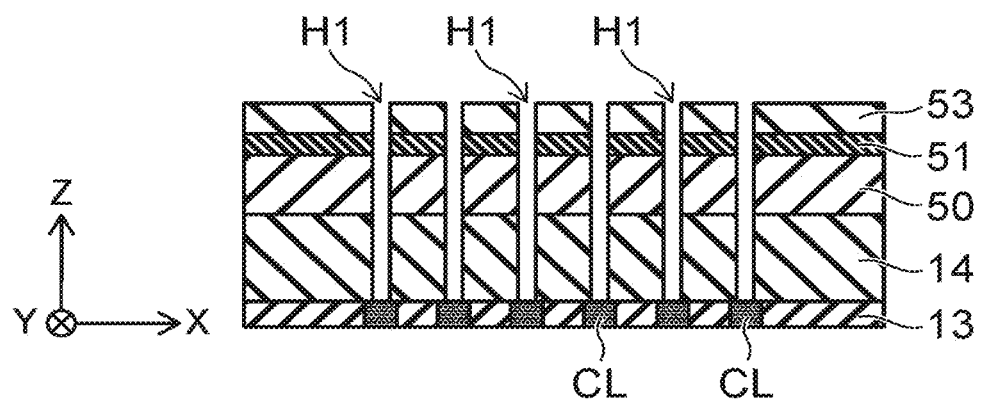

Then, as shown in FIG. 7A, multiple holes H1 are formed from the protrusions of the unevennesses 51a by etching such as RIE, etc. The holes H1 pierce the resist film 51, the film 50, and the insulating layer 14 and are formed in ellipse configurations having the Y-direction as major axes and the X-direction as minor axes when viewed from the Z-direction. The holes H1 are patterned at positions directly above the columnar portions CL using etching conditions such that, for example, lengths (widths, for example) in the Y-direction (the ellipse major-axis direction) decrease toward the columnar portions CL and are formed in tapered configurations in the direction toward the columnar portions CL in the Y-Z cross section (referring to FIG. 4A).

FIG. 8 is the arrangement of contact holes CH obtained by NIL when viewed from the Z-direction. FIG. 8 shows that the configurations of the contact holes CH are ellipses when viewed from the Z-direction; and the positional relationship is such that a portion of one contact hole CH of mutually-adjacent contact holes CH overlaps a portion of the other contact hole CH of the mutually-adjacent contact holes CH when viewed from the X-direction (the ellipse minor-axis direction).

Figure 7B:
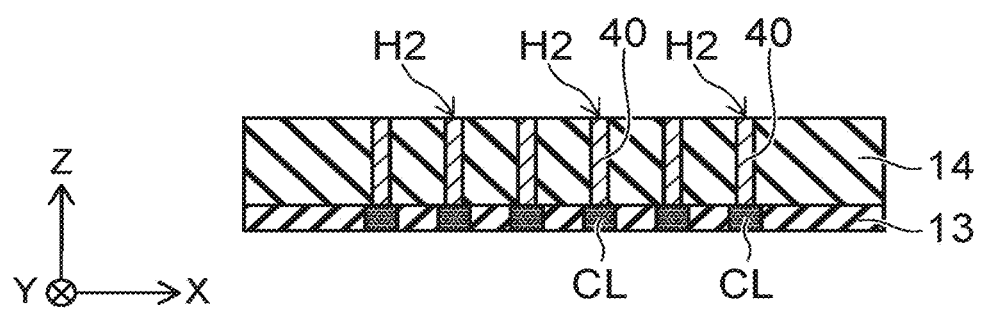

Then, as shown in FIG. 7B, for example, the film 53, the resist film 51, and the film 50 are removed by etching. Thereby, holes H2 are formed inside the insulating layer 14. The holes H2 are multiply formed and pierce the insulating layer 14. The holes H2 are portions of the holes H1 and correspond to contact holes.

Continuing, the contacts 40 are formed by, for example, filling a conductive material such as a metal, etc., into the holes H2 by CVD. The contacts 40 are multiply formed. The contacts 40 are formed to be positioned directly above the columnar portions CL.

Subsequently, the multiple bit lines BL that extend in the Y-direction are formed above the contacts 40. The upper ends of the columnar portions CL (the channels 21) are connected to the bit lines BL via the contacts 40.

Thus, the semiconductor memory device 1 according to the embodiment is manufactured.

Effects of the embodiment will now be described.

In a semiconductor memory device having a three-dimensional structure, there are cases where the columnar portions are arranged in a staggered configuration when viewed from the Z-direction because the columnar portions have a highly-dense arrangement with respect to the electrode layers. The multiple bit lines extend above the columnar portion; and the columnar portion and the bit line are connected via multiple contacts, e.g., two contacts. In the case where the columnar portion and the bit line are connected via two contacts having circular columnar configurations, the lower contact is provided above the columnar portion and has about the same diameter as the columnar portion; and the upper contact is provided between the lower contact and the bit line and has about the same diameter as the width of the bit line.

However, as the memory cells are downscaled, the spacing of the columnar portions decreases; and it becomes difficult to form the multiple contacts in stages. For example, in the case where the upper contact is formed using photolithography, the upper contact is patterned in the photolithography by using a diameter that is about 3 times the diameter of the upper portion of the lower contact. That is, in the patterning of the photolithography, the contacts that are positioned above mutually-adjacent columnar portions are arranged to have a prescribed distance in the Y-direction.

Accordingly, it is difficult to arrange the columnar portions with high density with respect to the electrode layers because contact between the contacts of the exposure must be suppressed.

In the case where the multiple contacts are formed in stages, the contact surface area of the upper contact for contacting the lower contact, i.e., the surface area of the lower surface of the upper contact, easily becomes small. Thereby, the contact resistance increases; and the electrical characteristics of the semiconductor memory device degrade.

In the case where the multiple contacts are formed in stages, the thickness in the Z-direction of the entire contact undesirably becomes thick. For example, in the case where the contact is formed by filling a metal and/or a metal-including substance after forming a contact hole in an insulating layer, the fillability of the contact hole degrades.

Conversely, the columnar portions CL that are provided in the semiconductor memory device 1 of the embodiment have a positional relationship such that for mutually-adjacent columnar portions CL, a portion of the contact 40 positioned above one columnar portion CL overlaps a portion of the contact 40 positioned at the other columnar portion CL when viewed from the X-direction. Also, such contacts 40 are formed by, for example, NIL.

By providing the contacts 40 in the semiconductor memory device 1 in the embodiment, the columnar portions CL can be arranged with high density with respect to the electrode layers 11. For example, by forming the contacts 40 by using NIL, the columnar portions CL can be arranged with high density with respect to the electrode layers 11. For example, as in FIG. 2 and FIG. 4A, the columnar portions CL can be arranged with high density with respect to the electrode layers 11 so that the contact 40 of the columnar portion CL1 and the contact 40 of the columnar portion CL2 overlap by the amount of the distance d2 at the upper ends when viewed from the X-direction.

By providing the contacts 40 in the semiconductor memory device 1 in the embodiment, the contact surface areas of the contact 40, i.e., the surface areas of the upper surface and the lower surface of the contact 40, can be large. Thereby, the contact resistance is small; and the electrical characteristics of the semiconductor memory device 1 improve.

By providing the contacts 40 in the semiconductor memory device 1 in the embodiment, compared to the case where the multiple contacts are formed in stages, the manufacturing processes of the semiconductor memory device 1 can be reduced by reducing the formation processes of the contacts. Further, the thickness in the Z-direction of the contact 40 can be small compared to the case where the multiple contacts are formed in stages. Thereby, in the case where the contacts 40 are formed by filling a metal and/or a metal-including substance after forming the contact holes (the holes H2) in the insulating layer 14, the fillability of the contact holes improves.

According to the embodiment, a semiconductor memory device and a method for manufacturing the semiconductor memory device are provided in which the degradation of the density at which the memory cells are formed is suppressed and the electrical characteristics improve.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions. Moreover, above-mentioned embodiments can be combined mutually and can be carried out.

What is claimed is:

1. A semiconductor memory device, comprising:
a substrate;
a stacked body provided above the substrate, the stacked body including a plurality of electrode layers stacked to be separated from each other;
a plurality of columnar portions extending through the stacked body in a stacking direction of the plurality of electrode layers of the stacked body, each of the plurality of columnar portions including a semiconductor portion;
a plurality of interconnects extending in a first direction and being electrically connected to the semiconductor portions of the plurality of columnar portions, the first direction being parallel to an upper surface of the substrate; and
a plurality of connection portions provided between the plurality of columnar portions and the plurality of interconnects, the plurality of connection portions including a connection portion connected correspondingly to one columnar portion of the plurality of columnar portions and one interconnect of the plurality of interconnects,
wherein a portion of a first connection portion extending in the first direction overlaps a portion of a second connection portion extending in the first direction when viewed from a second direction perpendicular to the stacking direction and the first direction,
the first connection portion is connected to a first interconnect of the plurality of interconnects,
the second connection portion is connected to a second interconnect of the plurality of interconnects, and
the first interconnect and the second interconnect are the nearest interconnects to each other in the second direction.

2. The device according to claim 1, wherein configurations of the first connection portion and the second connection portion are ellipses when viewed from the stacking direction.

3. The device according to claim 1, wherein
lower surfaces of the plurality of connection portions contact the semiconductor portions of the plurality of columnar portions, and
upper surfaces of the plurality of connection portions contact the plurality of interconnects.

4. The device according to claim 1, wherein lengths in the first direction of the plurality of connection portions decrease toward the plurality of columnar portions.

5. The device according to claim 1, wherein the plurality of connection portions includes first portions contacting the semiconductor portions of the plurality of columnar portions, and second portions provided above the first portions and contacting the plurality of interconnects.

6. The device according to claim 1, wherein
the plurality of columnar portions are provided in a plurality of columns arranged along the first direction, and
the columnar portions of each column are arranged along the second direction.

7. The device according to claim 1, wherein
the semiconductor portions of the plurality of columnar portions extend in the stacking direction, and
one of the plurality of columnar portions includes a charge storage film provided between one of the semiconductor portions and one of the plurality of electrode layers.

* * * * *